(12) United States Patent
He

(10) Patent No.: US 10,873,182 B2
(45) Date of Patent: Dec. 22, 2020

(54) ELECTROSTATIC DISCHARGE PROTECTION CIRCUIT AND DISPLAY DEVICE APPLYING THE SAME

(71) Applicant: HKC Corporation Limited, Shenzhen, Guangdong (CN)

(72) Inventor: Huailiang He, Shenzhen (CN)

(73) Assignee: HKC CORPORATION LIMITED, Guangdong (CN)

( * ) Notice: Subject to any disclaimer, the term of this patent is extended or adjusted under 35 U.S.C. 154(b) by 391 days.

(21) Appl. No.: 15/743,256

(22) PCT Filed: Oct. 20, 2017

(86) PCT No.: PCT/CN2017/107022
§ 371 (c)(1),
(2) Date: Jan. 9, 2018

(87) PCT Pub. No.: WO2019/051924
PCT Pub. Date: Mar. 21, 2019

(65) Prior Publication Data
US 2019/0115751 A1 Apr. 18, 2019

(30) Foreign Application Priority Data
Sep. 14, 2017 (CN) .......................... 2017 1 0828443

(51) Int. Cl.
*H02H 9/04* (2006.01)
*H01L 27/02* (2006.01)
(Continued)

(52) U.S. Cl.
CPC ....... *H02H 9/046* (2013.01); *G02F 1/136204* (2013.01); *H01L 27/0266* (2013.01); *H02H 9/04* (2013.01); *H05F 3/02* (2013.01)

(58) Field of Classification Search
CPC ............ H01L 27/0266; H01L 27/1244; H02H 9/04–046; G02F 1/136204; H05F 3/02
See application file for complete search history.

(56) References Cited

U.S. PATENT DOCUMENTS

| | | | | |
|---|---|---|---|---|
| 6,741,037 B2* | 5/2004 | Lee | ...................... | G09G 3/3233 315/169.1 |
| 2014/0126093 A1* | 5/2014 | Duan | ................ | G02F 1/136204 361/56 |

(Continued)

FOREIGN PATENT DOCUMENTS

| | | |
|---|---|---|
| CN | 102655145 A | 9/2012 |
| CN | 103944154 A | 7/2014 |

(Continued)

*Primary Examiner* — Jared Fureman
*Assistant Examiner* — Christopher J Clark
(74) *Attorney, Agent, or Firm* — Muncy, Geissler, Olds & Lowe, P.C.

(57) ABSTRACT

This application relates to an electrostatic discharge (ESD) protection circuit, includes: a first switch, electrically coupled to a first node through a control end, electrically coupled to a ground node through a first end, and electrically coupled to a signal input node through a second end; a capacitor electrically coupled between the first node and the signal input node; a second switch, electrically coupled to a low level line through a control end and a first end, and electrically coupled to the signal input node through a second end; and a third switch, electrically coupled to a high level line through a control end, and electrically coupled to the first node through a first end, being electrically coupled to the low level line through a second end.

20 Claims, 8 Drawing Sheets

(51) Int. Cl.
*G02F 1/1362* (2006.01)
*H05F 3/02* (2006.01)

(56) References Cited

U.S. PATENT DOCUMENTS

| | | | |
|---|---|---|---|
| 2014/0192444 A1* | 7/2014 | Wu | H01L 27/0296 |
| | | | 361/56 |
| 2015/0085406 A1 | 3/2015 | Chen et al. | |
| 2017/0110478 A1* | 4/2017 | Gai | H01L 27/0292 |
| 2019/0204693 A1* | 7/2019 | Chen | G09G 3/20 |

FOREIGN PATENT DOCUMENTS

| | | |
|---|---|---|
| CN | 106932987 A | 7/2017 |
| JP | 2009-003916 A | 1/2009 |

\* cited by examiner

ELECTROSTATIC DISCHARGE PROTECTION CIRCUIT AND DISPLAY DEVICE APPLYING THE SAME

BACKGROUND

Technical Field

This application relates to an electrostatic discharge (ESD) protection circuit and a display device using the ESD protection circuit, and in particular, to an ESD protection circuit composed of a plurality of switch components and a display device using the ESD protection circuit.

Related Art

Electrostatic (charge) is a positive or negative charge formed on an object surface by charge imbalance due to some reasons. Electrostatic Discharge (ESD) occurs when the charge is transferred and different potentials discharge mutually. When the electrostatic voltage is 2000 V, the human body cannot feel it. However, electrostatic sensitive components used in our production may be damaged by it, because a CMOS integrated circuit device can only withstand a voltage of 250 V to 2000 V, and would cause damage once the voltage is exceeded. ESD may cause breakdown of an integrated circuit chip medium, fusing of core wires, accelerated aging of leakage currents, change of electrical performance parameters and so on.

Currently, a LCD panel circuit has a relatively serious ESD phenomenon, and it is very common that circuits are damaged by ESD. To prevent ESD from damaging internal lines or components of a LCD panel, especially for active switches (Thin film transistor, TFT), an ESD protection circuit is generally designed on the LCD panel. When an ESD voltage is present on a pixel array, an ESD protection circuit made beside the pixel array has to be capable of switching on early to discharge ESD currents. Therefore, components used in the ESD protection circuit have to have a relatively low breakdown voltage or a relatively high turn-on speed.

In terms of a-Si, whether it is in a full N-type active switch (NTFT) or a full P-type active switch (PTFT) process, the gate and the drain of the active switch are usually connected, i.e., an equivalent diode assembly can be formed. Two equivalent diode assemblies form a group, two ends are respectively electrically coupled to a high level line (VGH) and a low level line (VGL), and a node connected to the two assemblies is then connected to a signal circuit or a power circuit, to thus form an ESD protection circuit. When high-voltage static electricity enters the signal circuit or the power circuit, there would be a group of forward or reverse equivalent diode assemblies corresponding to the high-voltage static electricity whether the high-voltage static electricity is a positive voltage or a negative voltage, to discharge the positive voltage or the negative voltage through the unilateral connection characteristic of diodes.

However, the high level line and the low level line are generally thin, such that lines connected to upper and lower ends of the equivalent diode assemblies would form relatively great equivalent resistance respectively. Therefore, a discharge current may be relatively small, not being conducive to ESD.

SUMMARY

To resolve the foregoing technical problem, this application is aimed at providing an ESD protection circuit, to increase a discharge path to increase the rate of ESD.

The objective of this application and the solution to the technical problem thereof are implemented through the following technical solution. An ESD protection circuit according to this application includes: a first switch, electrically coupled to a first node through a control end of the first switch, electrically coupled to a ground node through a first end of the first switch, and electrically coupled to a signal input node through a second end of the first switch; a capacitor electrically coupled between the first node and the signal input node; a second switch, electrically coupled to a first level line through a control end and a first end of the second switch, and electrically coupled to the signal input node through a second end of the second switch; and the third switch, electrically coupled to a second level line through a control end of the third switch, and electrically coupled to the first node through a first end of the third switch, and electrically coupled to the first level line through a second end of the third switch; wherein the signal input node obtained a static electricity, a potential of the static electricity is incompatible with a potential of the second level line, the capacitor is voltage-regulated due to the static electricity to adjust a potential of the first node, to open the first switch and the third switch, and the static electricity passes through the first switch and the third switch to discharge towards the ground node and the first level line.

This application may further resolve the technical problem thereof through the following technical measures.

In an embodiment of this application, the first switch, the second switch and the third switch are N-type transistors, the first level line is a low level line, and the second level line is a high level line.

In an embodiment of this application, the potential of the first node is equal to that of the low level line, and the first switch is turned off.

In an embodiment of this application, the signal input node gets positive-potential static electricity, and when the potential of the positive-potential static electricity is a potential between the high level line and the low level line, the first switch and the third switch are turned off.

In an embodiment of this application, the first switch, the second switch and the third switch are P-type transistors, the first level line is a high level line, and the second level line is a low level line.

In an embodiment of this application, the potential of the first node is equal to that of the high level line, and the first switch is turned off.

In an embodiment of this application, the signal input node gets negative-potential static electricity, and when the potential of the negative-potential static electricity is a potential between the high level line and the low level line, the first switch and the third switch are turned off.

In an embodiment of this application, when the potential of the static electricity is a potential between the second level line and the first level line, the capacitor forms an open circuit to down-regulate the potential of the first node.

A second objective of this application is an ESD protection circuit, including: a first switch, electrically coupled to a first node through a control end of the first switch, and electrically coupled to a ground node through a first end of the first switch, and electrically coupled to a signal input node through a second end of the first switch; a capacitor electrically coupled between the first node and the signal input node; a second switch, electrically coupled to a first level line through a control end and a first end of the second switch, and electrically coupled to the signal input node through a second end of the second switch; and a third switch, electrically coupled to a second level line through a control end of the third switch, and electrically coupled to the first node through a first end of the third switch, and electrically coupled to the first level line through a second end of the third switch; wherein the signal input node obtained a static electricity, the potential of the static electricity is incompatible with a potential of the second level line, the capacitor is voltage-regulated due to the static electricity to up-regulate a potential of the first node, to open the first switch and the third switch to make the first node electrically coupled to the first level line, and the static electricity passes through the first switch and the third switch to discharge towards the ground node and the first level line; when the potential of the static electricity is a potential between the first level line and the second level line, the capacitor forms an open circuit to down-regulate the potential of the first node, to turn off the first switch and the third switch; the ground node is electrically coupled to a ground wire or a common voltage wire; and operating currents of the first switch and the second switch are below 1 µA.

Another objective of this application is a display panel, including a display panel; and the ESD protection circuit having the technical features in any of the above embodiments.

This application increases a discharge path to increase the rate of ESD and the electric quantity, avoiding that ESD causes damage to internal lines or components of a LCD panel. The improvement to the circuit is easy to implement, and also helps enhance reliability of the circuit. It is applicable to making of panels of various sizes, and the applicability is relatively high.

DETAILED DESCRIPTION

The following embodiments are described with reference to the accompanying drawings, which are used to exemplify specific embodiments for implementation of this application. Terms about directions mentioned in this application, such as "on", "below", "front", "back", "left", "right", "in", "out", and "side surface" merely refer to directions in the accompanying drawings. Therefore, the used terms about directions are used to describe and understand this application, and are not intended to limit this application.

The accompanying drawings and the description are considered to be essentially exemplary, rather than limitative. In the figures, units with similar structures are represented by using the same reference number. In addition, for understanding and ease of description, the size and the thickness of each component shown in the accompanying drawings are arbitrarily shown, but this application is not limited thereto.

In the accompanying drawings, for clarity and ease of understanding and description, components are enlarged. It should be understood that when a component is described to be "on" "another component", the component may be directly on another component, or there may be an intermediate component.

In addition, throughout this specification, unless otherwise explicitly described to have an opposite meaning, the word "include" is understood as including the component, but not excluding any other component. In addition, throughout the specification, "on" means that one is located above or below a target component and does not necessarily mean that one is located on the top based on a gravity direction.

To further describe the technical measures taken in this application to achieve the intended invention objective and effects thereof, specific implementations, structures, features, and effects of an ESD protection circuit and a display panel applying the same that are provided according to this application are described below in detail with reference to the drawings and preferred embodiments.

The display panel of this application may include an active array (TFT) substrate and a color filter (CF) substrate.

In some embodiments, the display panel of this application may be a curved display panel.

In some embodiments, the active array (TFT) and the color filter (CF) of this application may be formed on the same substrate.

Figure 1A:
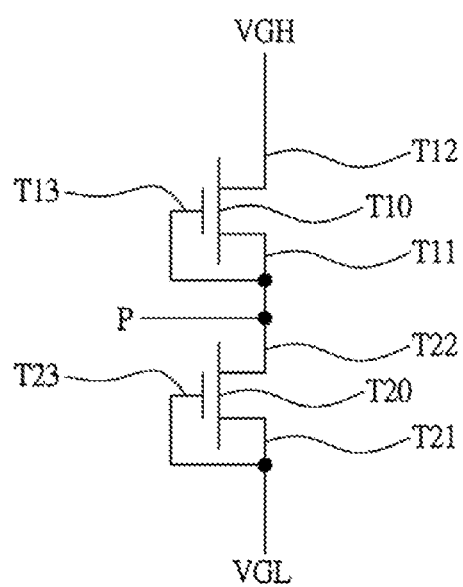
FIG. 1a is a schematic diagram of an exemplary ESD protection circuit.

FIG. 1a is a schematic diagram of an exemplary ESD protection circuit. Referring to FIG. 1a, an ESD protection circuit includes a first switch T10 and a second switch T20, which are both N-type active switches (NTFT). A first end T11 of the first switch T10 is a drain (D), a second end T12 of the first switch T10 is a source (S), and a control end T13 of the first switch T10 is a gate (G). A first end T21 of the second switch T20 is a drain (D), a second end T22 of the second switch T20 is a source (S), and a control end T23 of the second switch T20 is a gate (G). The control end T13 and the first end T11 of the first switch T10 are connected, and the control end T23 and the first end T21 of the second switch T20 are connected. The second end T12 of the first switch T10 is electrically coupled to a high level line VGH, the first end T21 of the second switch T20 is electrically coupled to a low level line VGL, and a node connected to the first switch T10 and the second switch T20 is further connected to a signal input connection point P, to thus form an ESD protection circuit.

Figure 1B:
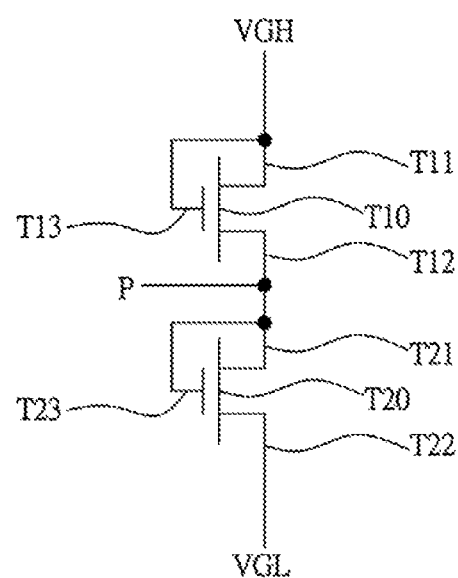
FIG. 1b is a schematic diagram of an exemplary ESD protection circuit.

FIG. 1b is a schematic diagram of an exemplary ESD protection circuit. Referring to FIG. 1b, an ESD protection circuit includes a first switch T10 and a second switch T20, which are both P-type active switches (NTFT). A first end T11 of the first switch T10 is a drain (D), a second end T12 of the first switch T10 is a source (S), and a control end T13 of the first switch T10 is a gate (G). A first end T21 of the second switch T20 is a drain (D), a second end T22 of the second switch T20 is a source (S), and a control end T23 of the second switch T20 is a gate (G). The control end T13 and the first end T11 of the first switch T10 are connected, and the control end T23 and the first end T21 of the second switch T20 are connected. The first end T11 of the first switch T10 is electrically coupled to a high level line VGH, the second end T22 of the second switch T20 is electrically coupled to a low level line VGL, and a node connected to the first switch T10 and the second switch T20 is further connected to a signal input connection point P, to thus form an ESD protection circuit.

Figure 1C:
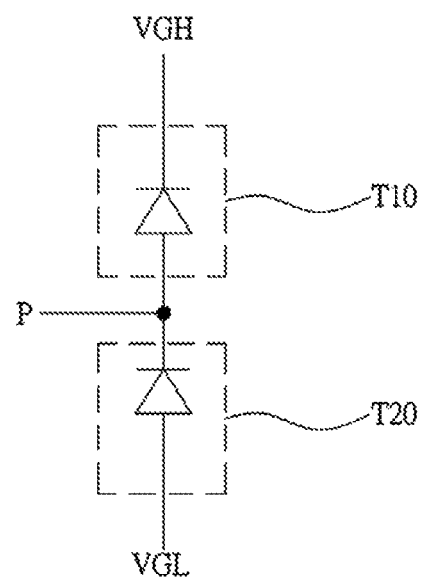
FIG. 1c is a schematic diagram of a theoretical equivalent circuit of an exemplary ESD protection circuit.

FIG. 1c is a schematic diagram of a theoretical equivalent circuit of an exemplary ESD protection circuit, which is a schematic diagram of a theoretical equivalent circuit of the ESD protection circuits shown in FIG. 1a and FIG. 1b. In terms of a-Si, in a full N-type active switch (NTFT) process, the gate and the grain of the N-type active switch are generally connected, i.e., an equivalent diode assembly can be formed. Therefore, after the control end T13 and the first end T11 of the first switch T10 are connected and the control end T23 and the first end T21 of the second switch T20 are connected, the first switch T10 and the second switch T20 form an equivalent diode assembly respectively. Two equivalent diode assemblies form a group, two ends thereof are respectively electrically coupled to a high level line VGH and a low level line VGL, and a node connected to the two assemblies is then connected to a signal input connection point P. In terms of a-Si, in a full P-type active switch (PTFT) process, the gate and the grain of the P-type active switch are generally connected, i.e., an equivalent diode assembly can be formed. Therefore, after the control end T13 and the first end T11 of the first switch T10 are connected and the control end T23 and the first end T21 of the second switch T20 are connected, the first switch T10 and the second switch T20 form an equivalent diode assembly respectively. Two equivalent diode assemblies form a group, two ends thereof are respectively electrically coupled to a high level line VGH and a low level line VGL, and a node connected to the two assemblies is then connected to a signal input connection point P.

When high-voltage static electricity enters the signal input connection point P, there would be a group of forward or reverse equivalent diode assemblies corresponding to the high-voltage static electricity whether the high-voltage static electricity is a positive voltage or a negative voltage. Based on the unilateral connection characteristic of diodes, positive and negative charges of the high-voltage static electricity can rapidly discharge to the high level line and the low level line, to discharge the positive voltage or the negative voltage.

Figure 1D:
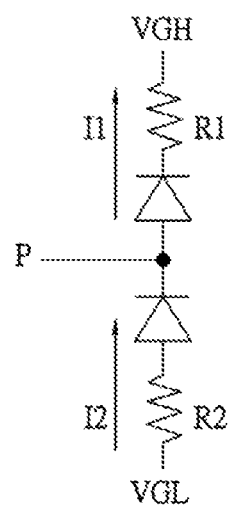
FIG. 1d is a schematic diagram of an actual equivalent circuit of an exemplary ESD protection circuit.

FIG. 1d is a schematic diagram of an actual equivalent circuit of an exemplary ESD protection circuit, which is a schematic diagram of an actual equivalent circuit of the ESD protection circuits shown in FIG. 1a and FIG. 1b. As shown in FIG. 1c, line widths of the high level line VGH and the low level line VGL are generally fine; therefore, a line at the second end T12 of the first switch T10 and a line at the first end T21 of the second switch T20 may generate equivalent resistors (R1, R2) with relatively great resistance, and the electrostatic current I1 or I2 relative to discharge is relatively small.

Figure 2A:
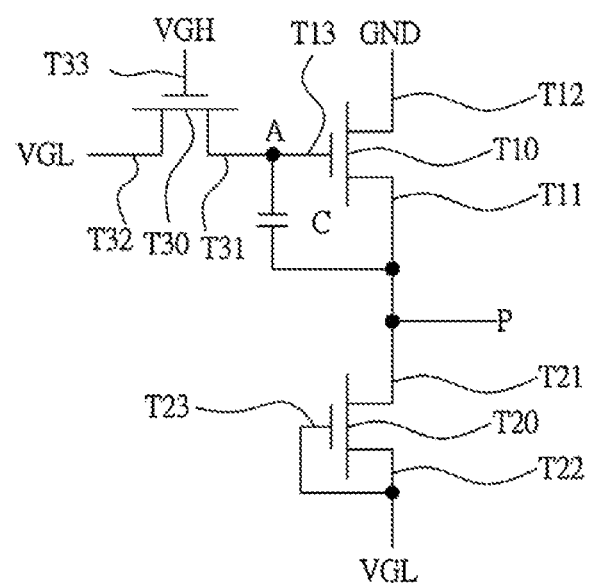
FIG. 2a is a schematic diagram of application of a method according to an embodiment of this application to an ESD protection circuit.

FIG. 2a is a schematic diagram of application of a method according to an embodiment of this application to an ESD protection circuit. Referring to FIG. 2a, an ESD protection circuit 300 includes: a first switch T10, electrically coupled to a first node A through a control end T13 of the first switch T10, electrically coupled to a ground node GND through a first end T11 of the first switch T10, and electrically coupled to a signal input node P through a second end T12 of the first switch T10; a capacitor C electrically coupled between the first node A and the signal input node P; a second switch T20, electrically coupled to a first level line through a control end T23 and a first end T21 of the second switch T20, and electrically coupled to the signal input node P a second end T22 of the second switch T20; and a third switch T30, electrically coupled to a second level line through a control end T33 of the third switch T30, and electrically coupled to the first node A through a first end T31 of the third switch T30, and electrically coupled to the first level line through a second end T32 of the third switch T30; wherein the signal input node P obtained a static electricity, the potential of the static electricity is incompatible with a potential of the second level line, the capacitor C is voltage-regulated due to the static electricity to adjust a potential of the first node A, to open the first switch T10 and the third switch T30, and the static electricity passes through the first switch T10 and the third switch T30 to discharge towards the ground node GND and the first level line.

In some embodiments, the ground node GND is electrically coupled to a ground wire or a common voltage wire.

In some embodiments, the signal input node P is electrically coupled to a line transmitting signals or power. The line includes a data line, a gate line, a gamma line, a reference voltage line (Vref Line), a sequential control line (CK Line), an enabled line (OE Line) and other identical, related and similar lines, but is not limited thereto. Lines capable of transmitting signals or power are applicable thereto.

In some embodiments, when the potential of the static electricity is a potential between the second level line and the first level line, the capacitor forms an open circuit to down-regulate the potential of the first node.

In some embodiments, the first switch T10, the second switch T20 and the third switch T30 are depleted transistors.

In some embodiments, the first end T11 of the first switch T10 is a drain (D), the second end T12 of the first switch T10 is a source (S), and the control end T13 of the first switch T10 is a gate (G); the first end T21 of the second switch T20 is a drain (D), the second end T22 of the second switch T20 is a source (S), and the control end T23 of the second switch T20 is a gate (G); the first end T31 of the third switch T30 is a drain (D), the second end T32 of the third switch T30 is a source (S), and the control end T33 of the third switch T30 is a gate (G).

Figure 2B:
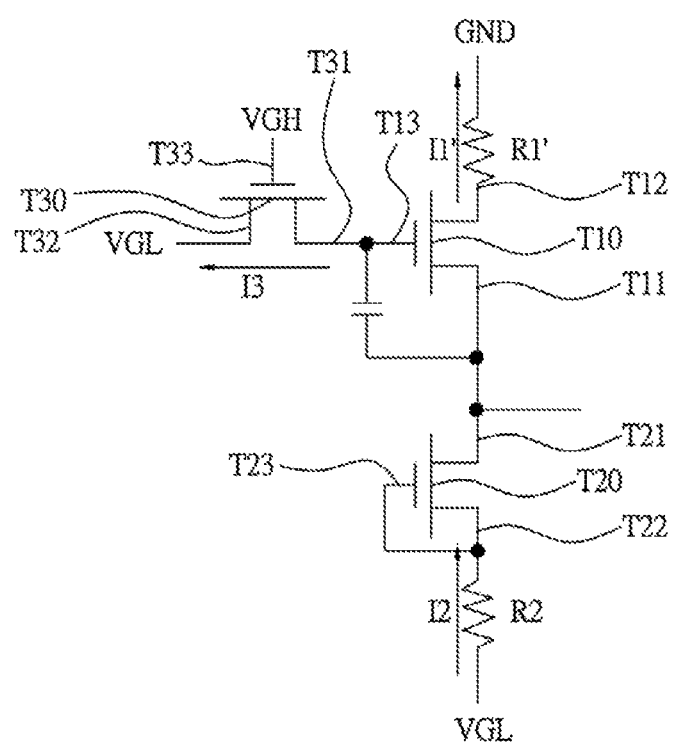
FIG. 2b is a schematic diagram of application of a method according to an embodiment of this application to an ESD protection circuit.

FIG. 2b is a schematic diagram of application of a method according to an embodiment of this application to an ESD protection circuit, which is a schematic diagram of an actual equivalent circuit of the ESD protection circuit shown in FIG. 2a.

In an embodiment of this application, the first switch T10, the second switch T20 and the third switch T30 are N-type transistors, the first level line is a low level line VGL, and the second level line is a high level line VGH.

As stated above, line widths of the high level line VGH and the low level line VGL are generally fine; therefore, a line at the first end T11 of the first switch T10 and a line at the first end T21 of the second switch T20 may generate equivalent resistors with relatively great resistance. In this example, a first equivalent resistor R1' is formed between the first switch T10 and the ground node GND, and a second equivalent resistor R2' is formed between the second switch T20 and the low level line VGL.

In some embodiments, the signal input node gets positive-potential static electricity, and the potential of the positive-potential static electricity is higher than that of the high level line VGH. The capacitor C is affected by the positive-potential static electricity. In combination with special effects of capacity coupling, the cross-voltage of the capacitor C is improved, thereby improving the potential of the first node A, to open the first switch T10. However, the drain (D) of the first switch T10, i.e., the first end T11, is connected to the ground node GND, for example, a ground wire (GND) or a common voltage wire (Vcom). Generally, the line width of the ground wire or the common voltage wire is much greater than the line width of the low level line VGL. Therefore, R1' may be smaller than R1, and the generated current I1' is also greater than the original I1. Secondly, the potential of the first node A is improved, which would turn on the third switch T30, thereby generating a current I3, to form another ESD path. Therefore, through the third switch T30, the positive-potential static electricity introduced by the signal input node P can discharge to the low level line VGL. Therefore, the magnitude of current that an electrostatic path can discharge is the sum of the current I1' and the current I3. The total magnitude of discharge current is much more than the current I1, and thus there is a better protection effect on the static electricity.

In some embodiments, when the positive-potential static electricity discharges, the potential of the first node A may be gradually reduced. Once the potential of the first node A is equal to that of the low level line VGL, the first switch T10 is turned off.

In some embodiments, the capacitor C may be considered as an open circuit in a direct current, and has characteristics of blocking DC, making AC through, making high frequencies through and blocking low frequencies. Therefore, when the potential of the positive-potential static electricity got by the signal input node P is a potential between the high level line VGH and the low level line VGL, the first switch T10 and the third switch T30 are turned off, and the capacitor C is an open circuit in the circuit.

Figure 3A:
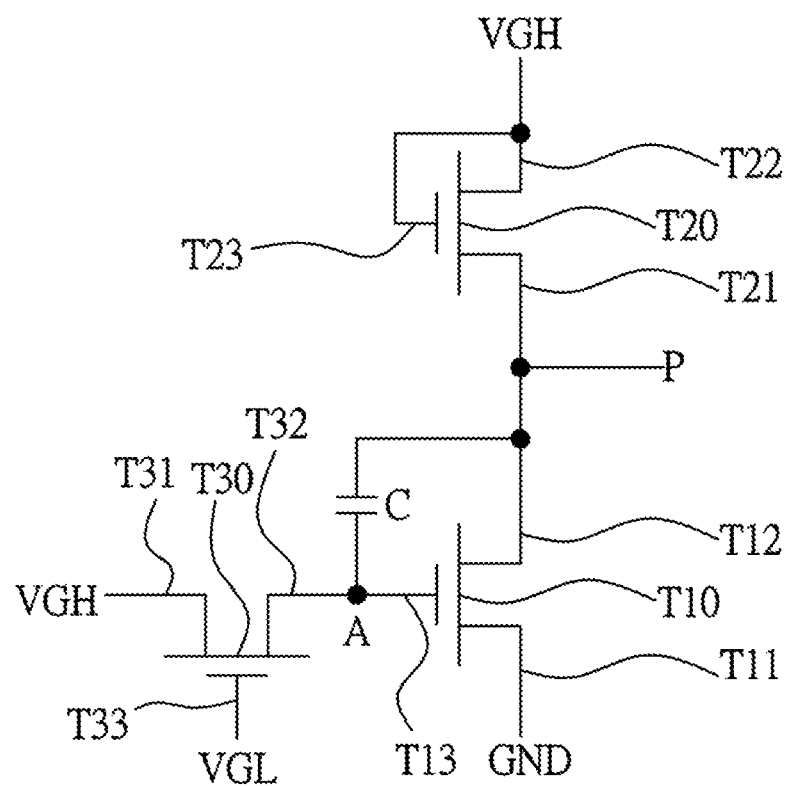
FIG. 3a is a schematic diagram of application of a method according to an embodiment of this application to an ESD protection circuit.

FIG. 3a is a schematic diagram of application of a method according to an embodiment of this application to an ESD protection circuit. Referring to FIG. 3a, an ESD protection circuit 300 includes: a first switch T10, electrically coupled to a first node A through a control end T13 of the first switch T10, and electrically coupled to a ground node GND through a first end T11 of the first switch T10, and electrically coupled to a signal input node P through a second end T12 of the first switch T10; a capacitor C electrically coupled between the first node A and the signal input node P; a second switch T20, electrically coupled to a first level line through a control end T23 and a first end T21 of the second switch T20, and electrically coupled to the signal input node P through a second end T22 of the second switch T20; and a third switch T30, electrically coupled to a second level line through a control end T33 of the third switch T30, and electrically coupled to the first node A through a first end T31 of the third switch T30, and electrically coupled to the first level line through a second end T32 of the third switch T30.

In some embodiments, the first switch T10, the second switch T20 and the third switch T30 are P-type transistors, the first level line is a high level line VGH, and the second level line is a low level line VGL.

In some embodiments, the first end T11 of the first switch T10 is a drain (D), the second end T12 of the first switch T10 is a source (S), and the control end T13 of the first switch T10 is a gate (G); the first end T21 of the second switch T20 is a drain (D), the second end T22 of the second switch T20 is a source (S), and the control end T23 of the second switch T20 is a gate (G); the first end T31 of the third switch T30 is a drain (D), the second end T32 of the third switch T30 is a source (S), and the control end T33 of the third switch T30 is a gate (G).

Figure 3B:
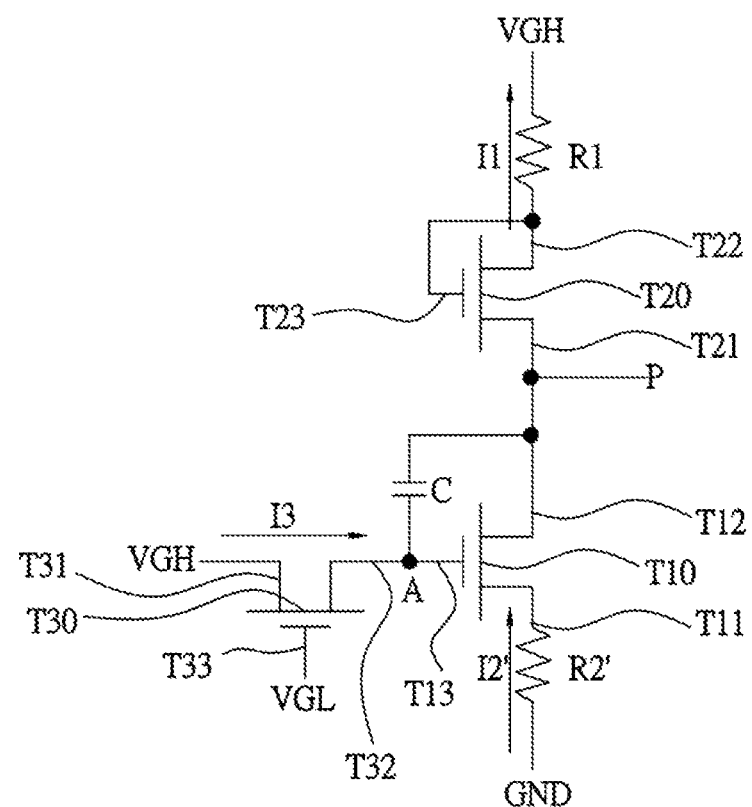
FIG. 3b is a schematic diagram of application of a method according to an embodiment of this application to an ESD protection circuit.

FIG. 3b is a schematic diagram of application of a method according to an embodiment of this application to an ESD protection circuit, which is a schematic diagram of an actual equivalent circuit of the ESD protection circuit shown in FIG. 2a. As stated above, line widths of the high level line VGH and the low level line VGL are generally fine; therefore, a line at the first end T21 of the second switch T20 and a line at the first end T11 of the first switch T10 may generate equivalent resistors with relatively great resistance. In this example, a first equivalent resistor R1' is formed between the second switch T20 and the low level line VGL, and a second equivalent resistor R2' is formed between the first switch T10 and the ground node GND.

In some embodiments, the signal input node P gets negative-potential static electricity, and the potential of the negative-potential static electricity is lower than that of the low level line VGL. The capacitor C is affected by the negative-potential static electricity. In combination with special effects of capacity coupling, the cross-voltage of the capacitor C is reduced, thereby reducing the potential of the first node A, to open the first switch T10. However, the drain (D) of the first switch T10, i.e., the first end T11, is connected to the ground node GND, for example, a ground wire (GND) or a common voltage wire (Vcom). Generally, the line width of the ground wire or the common voltage wire is much greater than the line width of the low level line VGL. Therefore, R2' may be smaller than R2, and the generated current I2' is also greater than the original I2. Secondly, the potential of the first node A is reduced, which would turn on the third switch T30, thereby generating a current I3, to form another ESD path. Therefore, through the third switch T30, the negative-potential static electricity introduced by the signal input node P can discharge to the high level line VGH. Therefore, the magnitude of current that an electrostatic path can discharge is the sum of the current I2' and the current I3. The total magnitude of discharge current is much more than the current I2, and thus there is a better protection effect on the static electricity.

In some embodiments, when the negative-potential static electricity discharges, the potential of the first node A may be gradually increased. Once the potential of the first node A is equal to that of the high level line VGL, the first switch T10 is turned off.

In some embodiments, the capacitor C may be considered as an open circuit in a direct current, and has characteristics of blocking DC, making AC through, making high frequencies through and blocking low frequencies. Therefore, when the potential of the negative-potential static electricity got by the signal input node P is a potential between the high level line VGH and the low level line VGL, the first switch T10 and the third switch T30 are turned off, and the capacitor C is an open circuit in the circuit.

In an embodiment of this application, an ESD protection circuit of this application includes: a first switch T10, electrically coupled to a first node A through a control end T13 of the first switch T10, electrically coupled to a ground node GND through a first end T11 of the first switch T10, and electrically coupled to a signal input node P through a second end T12 of the first switch T10; a capacitor C electrically coupled between the first node A and the signal input node P; a second switch T20, electrically coupled to a first level line through a control end T23 and a first end T21 of the second switch T20, and electrically coupled to the signal input node P through a second end T22 of the second switch T20; and a third switch T30, electrically coupled to a second level line through a control end T33 of the third switch T30, a first end T31 of the third switch T30 being electrically coupled to the first node A, and a second end T32 of the third switch T30 being electrically coupled to the first level line; wherein the signal input node P obtained a static electricity, the potential of the static electricity is incompatible with a potential of the second level line, the capacitor C is voltage-regulated due to the static electricity to adjust a potential of the first node A, to open the first switch T10 and the third switch T30, and the static electricity passes through the first switch T10 and the third switch T30 to discharge towards the ground node GND and the first level line, and operating currents of the first switch T10 and the second switch T20 are below 1 μA.

In an embodiment of this application, a display device of this application includes a control module, a display panel, and the ESD protection circuit having the technical features of any of the foregoing embodiments. The control module provides a control signal and a power signal. When a driving circuit of the display panel receives such signals, necessary data and power are transmitted to a display area, such that the display panel obtains power and signals presenting image demands. The ESD protection circuit 300 includes: a first switch T10, electrically coupled to a first node A through a control end T13 of the first switch T10, and electrically coupled to a ground node GND through a first end T11 of the first switch T10, and electrically coupled to a signal input node P through a second end T12 of the first switch T10; a capacitor C electrically coupled between the first node A and the signal input node P; a second switch T20, electrically coupled to a first level line through a control end T23 and a first end T21 of the second switch T20, and electrically coupled to the signal input node P through a second end T22 of the second switch T20; and a third switch T30, electrically coupled to a second level line through a control end T33 of the third switch T30, and electrically coupled to the first node A through a first end T31 of the third switch T30, and a second end T32 of the third switch T30 being electrically coupled to the first level line through a second end T32 of the third switch T30; wherein potentials of the first level line and the second level line connected to the ESD protection circuit 300 is controlled through the control module; the ground node GND is electrically coupled to a ground wire or a common voltage wire; the display panel includes a first panel and a second panel disposed oppositely, and the ESD protection circuit 300 may be disposed in at least one of the first panel and the second panel.

This application increases a discharge path to increase the rate of ESD and the electric quantity, avoiding that ESD causes damage to internal lines or components of a LCD panel. The improvement to the circuit is easy to implement, and also helps enhance reliability of the circuit. It is applicable to making of panels of various sizes, and the applicability is relatively high.

The wordings such as "in some embodiments" and "in various embodiments" are repeatedly used. The wordings usually refer to different embodiments, but they may also refer to a same embodiment. The words, such as "comprise", "have", and "include", are synonyms, unless other meanings are indicated in the context thereof.

The foregoing descriptions are merely preferred embodiments of this application, and are not intended to limit this application in any form. Although this application has been disclosed above through the preferred embodiments, the embodiments are not intended to limit this application. Any person skilled in the art can make some variations or modifications, which are equivalent changes, according to the foregoing disclosed technical content to obtain equivalent embodiments without departing from the scope of the technical solutions of this application. Any simple amendment, equivalent change, or modification made to the foregoing embodiments according to the technical essence of this application without departing from the content of the technical solutions of this application shall fall within the scope of the technical solutions of this application.

What is claimed is:

1. An electrostatic discharge (ESD) protection circuit, comprising:
    a first switch, electrically coupled to a first node through a control end of the first switch, and electrically coupled to a ground node through a first end of the first switch, and electrically coupled to a signal input node through a second end of the first switch;
    a capacitor electrically coupled between the first node and the signal input node;
    a second switch, electrically coupled to a first level line through a control end and a first end of the second switch, and electrically coupled to the signal input node through a second end of the second switch; and
    a third switch, electrically coupled to a second level line through a control end of the third switch, and electrically coupled to the first node through a first end of the third switch, and electrically coupled to the first level line through a second end of the third switch;
    wherein when static electricity having a voltage potential that is greater in magnitude than the voltage potential of the second level line is presented on the signal input node, the capacitor adjusts the voltage potential of the first node to turn on the first switch and the third switch, wherein the static electricity then discharges through the first switch towards the ground node and discharges through the third switch towards the first level line.

2. The ESD protection circuit according to claim 1, wherein the first switch, the second switch and the third switch are N-type transistors, the first level line is a low level line, and the second level line is a high level line.

3. The ESD protection circuit according to claim 2, wherein the potential of the first node is equal to that of the low level line, and the first switch is turned off.

4. The ESD protection circuit according to claim 2, wherein the signal input node gets positive-potential static electricity, and when the potential of the positive-potential static electricity is a potential between the high level line and the low level line, the first switch and the third switch are turned off.

5. The ESD protection circuit according to claim 1, wherein the first switch, the second switch and the third switch are P-type transistors, the first level line is a high level line, and the second level line is a low level line.

6. The ESD protection circuit according to claim 5, wherein the potential of the first node is equal to that of the high level line, and the first switch is turned off.

7. The ESD protection circuit according to claim 5, wherein the signal input node gets negative-potential static electricity, and when the potential of the negative-potential static electricity is a potential between the high level line and the low level line, the first switch and the third switch are turned off.

8. The ESD protection circuit according to claim 1, wherein when the potential of the static electricity is a potential between the second level line and the first level line, the capacitor forms an open circuit to down-regulate the potential of the first node.

9. The ESD protection circuit according to claim 1, wherein operating currents of the first switch and the second switch are below 1 µA.

10. An electrostatic discharge (ESD) protection circuit, comprising:
- a first switch, electrically coupled to a first node through a control end of the first switch, and electrically coupled to a ground node through a first end of the first switch, and electrically coupled to a signal input node through a second end of the first switch;
- a capacitor electrically coupled between the first node and the signal input node;
- a second switch, electrically coupled to a first level line through a control end and a first end of the second switch, and electrically coupled to the signal input node through a second end of the second switch; and
- a third switch, electrically coupled to a second level line through a control end of the third switch, and electrically coupled to the first node through a first end of the third switch, and electrically coupled to the first level line through a second end of the third switch;
- wherein when static electricity having a voltage potential that is greater in magnitude than the voltage potential of the second level line is presented on the signal input node, the capacitor adjusts the voltage potential of the first node to turn on the first switch and the third switch, wherein the static electricity then discharges through the first switch towards the ground node and discharges through the third switch towards the first level line;
- when the voltage potential of the static electricity is a voltage potential between the first level line and the second level line, the capacitor forms an open circuit to down-regulate the voltage potential of the first node, to turn off the first switch and the third switch;
- the ground node is electrically coupled to a ground wire or a common voltage wire; and
- operating currents of the first switch and the second switch are below 1 µA.

11. A display device, comprising:
- a display panel; and
- an electrostatic discharge (ESD) protection circuit, comprising:
- a first switch, electrically coupled to a first node through a control end of the first switch, and electrically coupled to a ground node through a first end of the first switch, and electrically coupled to a signal input node through a second end of the first switch;
- a capacitor electrically coupled between the first node and the signal input node;
- a second switch, electrically coupled to a first level line through a control end and a first end of the second switch, and electrically coupled to the signal input node through a second end of the second switch; and
- a third switch, electrically coupled to a second level line through a control end of the third switch, and electrically coupled to the first node through a first end of the third switch, and electrically coupled to the first level line through a second end of the third switch;
- wherein when static electricity having a voltage potential that is greater in magnitude than the voltage potential of the second level line is presented on the signal input node, the capacitor adjusts the voltage potential of the first node to turn on the first switch and the third switch, wherein the static electricity then discharges through the first switch towards the ground node and discharges through the third switch towards the first level line.

12. The display device according to claim 11, wherein the first switch, the second switch and the third switch are N-type transistors, the first level line is a low level line, and the second level line is a high level line.

13. The display device according to claim 12, wherein the potential of the first node is equal to that of the low level line, and the first switch is turned off.

14. The display device according to claim 12, wherein the signal input node gets positive-potential static electricity, and when the potential of the positive-potential static electricity is a potential between the high level line and the low level line, the first switch and the third switch are turned off.

15. The display device according to claim 11, wherein the first switch, the second switch and the third switch are P-type transistors, the first level line is a high level line, and the second level line is a low level line.

16. The display device according to claim 15, wherein the potential of the first node is equal to that of the high level line, and the first switch is turned off.

17. The display device according to claim 15, wherein the signal input node gets negative-potential static electricity, and when the potential of the negative-potential static electricity is a potential between the high level line and the low level line, the first switch and the third switch are turned off.

18. The display device according to claim 11, wherein when the potential of the static electricity is a potential between the second level line and the first level line, the capacitor forms an open circuit to down-regulate the potential of the first node.

19. The display device according to claim 11, wherein the ground node is electrically coupled to a ground wire or a common voltage wire.

20. The display device according to claim 11, wherein operating currents of the first switch and the second switch are below 1 µA.

* * * * *